United States Patent
Göbl et al.

(10) Patent No.: US 9,883,596 B2
(45) Date of Patent: Jan. 30, 2018

(54) METHOD FOR PRODUCING A SWITCHING DEVICE WITH A MOISTURE-TIGHT AND ELECTRICALLY INSULATING COVER AND FOR PRODUCING AN ARRANGEMENT THEREWITH

(71) Applicant: Semikron Elektronik GmbH & Co., KG, Nürnberg (DE)

(72) Inventors: Christian Göbl, Nürnberg (DE); Heinrich Heilbronner, Stein bei Nürnberg (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 0 days.

(21) Appl. No.: 14/924,679

(22) Filed: Oct. 27, 2015

(65) Prior Publication Data

US 2016/0120038 A1    Apr. 28, 2016

(30) Foreign Application Priority Data

Oct. 27, 2014   (DE) .................. 10 2014 115 565

(51) Int. Cl.
*H05K 3/32*        (2006.01)
*H01L 25/07*       (2006.01)
(Continued)

(52) U.S. Cl.
CPC ........... *H05K 3/32* (2013.01); *H01L 23/3121* (2013.01); *H01L 23/4985* (2013.01);
(Continued)

(58) Field of Classification Search
CPC ........ H05K 3/10; H05K 3/32; H01L 23/3121; H01L 23/367; H01L 23/49811;
(Continued)

(56) References Cited

U.S. PATENT DOCUMENTS 5,483,104 A * 1/1996 Godinho ........... H01L 21/76895
                                                257/401
5,639,989 A * 6/1997 Higgins, III .......... H01L 23/552
                                                174/386

(Continued)

FOREIGN PATENT DOCUMENTS

DE   10 2005 037 869 A1   2/2007
DE   10 2013 104 949 B3   4/2014

*Primary Examiner* — Carl Arbes
(74) *Attorney, Agent, or Firm* — The Law Offices of Roger S. Thompson

(57) ABSTRACT

A method for producing a power electronic switching device comprising a substrate, having a power semiconductor component arranged thereon; a connection device, and terminal devices. The method comprises: Providing the substrate with an insulation ply and conductor tracks electrically insulated from one another, wherein a power semiconductor component is arranged on a conductor track and is cohesively connected thereto; Arranging the connection device embodied as a film stack; Arranging a thin pressure- and temperature-resistant and moisture-blocking insulation layer along a surface contour of the connection device and comprising a covering section and an overlap section, which overlaps the connection device circumferentially and covers the substrate in a circumferential contact region; Cohesively connecting the connection device to the substrate, whereby the connection device connects the switching device in a circuit-conforming manner internally; Connecting the covering section to the connection device; Connecting the overlap section to the contact region.

22 Claims, 3 Drawing Sheets

(51) Int. Cl.
*H01L 23/498* (2006.01)
*H01L 23/31* (2006.01)
*H05K 3/10* (2006.01)
*H01L 23/00* (2006.01)
*H01L 23/367* (2006.01)

(52) U.S. Cl.
CPC .. *H01L 23/49811* (2013.01); *H01L 23/49833* (2013.01); *H01L 24/50* (2013.01); *H01L 24/86* (2013.01); *H01L 25/07* (2013.01); *H05K 3/10* (2013.01); *H01L 23/367* (2013.01); *H01L 2224/32225* (2013.01); *H01L 2224/73269* (2013.01); *H01L 2224/8384* (2013.01)

(58) Field of Classification Search
CPC ........... H01L 23/49835; H01L 23/4985; H01L 24/50; H01L 24/86; H01L 25/07; H01L 2224/32225; H01L 2224/73269; H01L 2224/8384; H01L 2924/00014
See application file for complete search history.

(56) References Cited

U.S. PATENT DOCUMENTS

| | | | |
|---|---|---|---|
| 7,589,418 B2 * | 9/2009 | Lederer | H01L 24/72 257/719 |
| 7,897,881 B2 | 3/2011 | Kaspar | |
| 9,530,712 B2 | 12/2016 | Göbl | |
| 2013/0176682 A1 * | 7/2013 | Besendorfer | H01L 23/18 361/707 |
| 2015/0069599 A1 | 3/2015 | Göbl | |
| 2015/0325494 A1 * | 11/2015 | Kroneder | H01L 23/4006 361/715 |

\* cited by examiner

METHOD FOR PRODUCING A SWITCHING DEVICE WITH A MOISTURE-TIGHT AND ELECTRICALLY INSULATING COVER AND FOR PRODUCING AN ARRANGEMENT THEREWITH

BACKGROUND OF THE INVENTION

1. Field of the Invention

The invention is directed to a method for producing a power electronic switching device with a moisture-tight and electrically insulating cover which can form a basic cell of a power semiconductor module or of a power electronic system by virtue of the fact that it forms the power electronic basic building block of the power semiconductor module or of the power electronic system by itself or in combination with further, preferably identical, basic cells. Furthermore, the invention describes an arrangement comprising such a power electronic switching device.

2. Description of the Related Art

The prior art, for example the device disclosed in German Patent Application DE 10 2013 104 949 B3, discloses a switching device which comprises a substrate, a power semiconductor component, a connection device, light terminal devices and a pressure device. In this device, the substrate has electrically insulated conductor tracks, with a power semiconductor component arranged on one of the conductor tracks. The connection device is embodied as a film composite comprising an electrically conductive film and an electrically insulating film and has a first and a second main surface. The switching device is thereby connected in a circuit-conforming manner internally. The pressure device comprises a pressure body having a first cutout, with a pressure element arranged in a manner projecting therefrom, wherein the pressure element presses on a section of the second main surface of the film composite and in this case this section, in projection along the direction of the normal to the power semiconductor component, is arranged within the area of the power semiconductor component.

Systems of this type constantly have a shortcoming with respect to protection against ingress of moisture in a manner adapted to the purpose of use, without detracting from the overall functionality of the device.

SUMMARY OF THE INVENTION

It is an object of the invention is to provide an improved method for producing a power electronic switching device.

It is therefore an object of the invention to provide, a method for producing a power electronic switching device which allows flexible production of very effective protection against moisture, and also an arrangement in which such a switching device is used.

The inventive method for producing a power electronic switching device comprising a substrate, a power semiconductor component arranged thereon, a connection device, and terminal devices. The method comprises the following steps:

A. Providing the substrate having an insulation ply and conductor tracks electrically insulated from one another, wherein a power semiconductor component is arranged on a conductor track and is cohesively connected to the conductor track;

B. Arranging the connection device which is embodied as a film stack and is embodied alternately with at least two electrically conductive, intrinsically structured films and an electrically insulating film respectively between two conductive films;

C. Arranging a thin pressure- and temperature-resistant and moisture-blocking insulation layer along a surface contour of the connection device, the insulation layer comprising a covering section on the connection device and an overlap section, which overlaps the connection device circumferentially on all sides and covers the substrate in a circumferential contact region;

D. Cohesively connecting the connection device to the substrate, whereby the switching device is connected in a circuit-conforming manner internally by means of the connection device;

E. Connecting the covering section of the insulation layer to the connection device; and F. Connecting the overlap section of the insulation layer to the contact region of the substrate.

The term "connecting" in steps E and F is understood, in particular, as cohesively connecting a film to the substrate for example in a laminating process. Alternatively, if the insulation layer is present as a liquid before being cured, it is understood to mean curing the liquid with at the same time a cohesive connection to the substrate.

Preferably, the method steps are performed in the order A-B-C-D-E-F or A-B-D-C-E-F, and in this case method steps E and F are performed simultaneously. Alternatively, the method steps are performed in the order A-E-B-C-D-F or A-E-B-D-C-F. As a third alternative, the method steps are performed in the order A-B-C-D-E-F and in this case method steps D, E and F are performed simultaneously.

It can be advantageous if at least the covering section of the insulation layer has a thickness of a maximum of about 1 mm, preferably of a maximum of about 500 μm, and of a minimum of about 50 μm, preferably of a minimum of about 150 μm. It is particularly preferred if the insulation layer is composed of polyphenylene sulfide—PPS—or of a liquid crystal polymer—LCP—known for example under the trade name Vectra LCP® from Ticona®.

It can be advantageous, on the one hand, if the insulation layer is embodied as a film and is arranged as such. Such film can be embodied with one or more plies. Likewise, the film can comprise at least three plies and in this case at least one metallic intermediate ply. In this case, the film can bear directly on the connection device to the extent of at least 90%, in particular to the extent of at least 95%.

It can be advantageous, on the other hand, if the insulation layer, prior to being arranged, is embodied as a liquid and is arranged in a spraying or pouring method. In this case, the liquid can be cured after being arranged.

In particular, it can be preferred if the contact region of the substrate comprises area sections of conductor tracks and area sections of the insulation ply and in its course the transition between these area sections is embodied in a continuous fashion. In this case, in a continuous fashion should be understood to mean the technical implementation of a transition without edges.

The inventive method for producing an arrangement comprising an abovementioned power electronic switching device, which includes a cooling device and a pressure device, the method comprising the following steps in this order:

a) providing the power electronic switching device produced according to a method mentioned above;

b) arranging the power electronic switching device on the cooling device;

c) arranging the pressure device, which comprises a pressure body having a first cutout, with an elastic pressure element arranged in a manner projecting therefrom, wherein the pressure element presses on a section of the insulation layer which, in projection along the direction of the normal to the power semiconductor component, is arranged within the area of the power semiconductor component; and d) applying pressure to the pressure device and thus thermally linking the substrate of the circuit arrangement to the cooling device.

It is therefore an object of the invention to provide a method for producing a power electronic switching device which allows flexible production of very effective protection against moisture, and also an arrangement in which such a switching device is used.

In this case, it is advantageous if the cooling device is a baseplate of a power semiconductor module or a heat sink.

It can be preferred if the pressure element in projection covers at least 60% of the area of the power semiconductor component.

Furthermore, the pressure device can have a spring-elastic pressure-introducing body that exerts pressure centrally on the pressure device.

It goes without saying that, unless ruled out per se, the features mentioned in the singular, in particular the power semiconductor component, can also be present multiply in the power electronic switching device.

It goes without saying that the different configurations of the invention can be realized individually or in arbitrary combinations in order to achieve improvements. In particular, the features mentioned above and explained here or hereinafter can be used not only in the combinations specified, but also in other combinations that are not mutually exclusive, or by themselves, without departing from the scope of the present invention.

Other objects and features of the present invention will become apparent from the following detailed description of the presently preferred embodiments, considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PRESENTLY PREFERRED EMBODIMENTS

Figure 1:
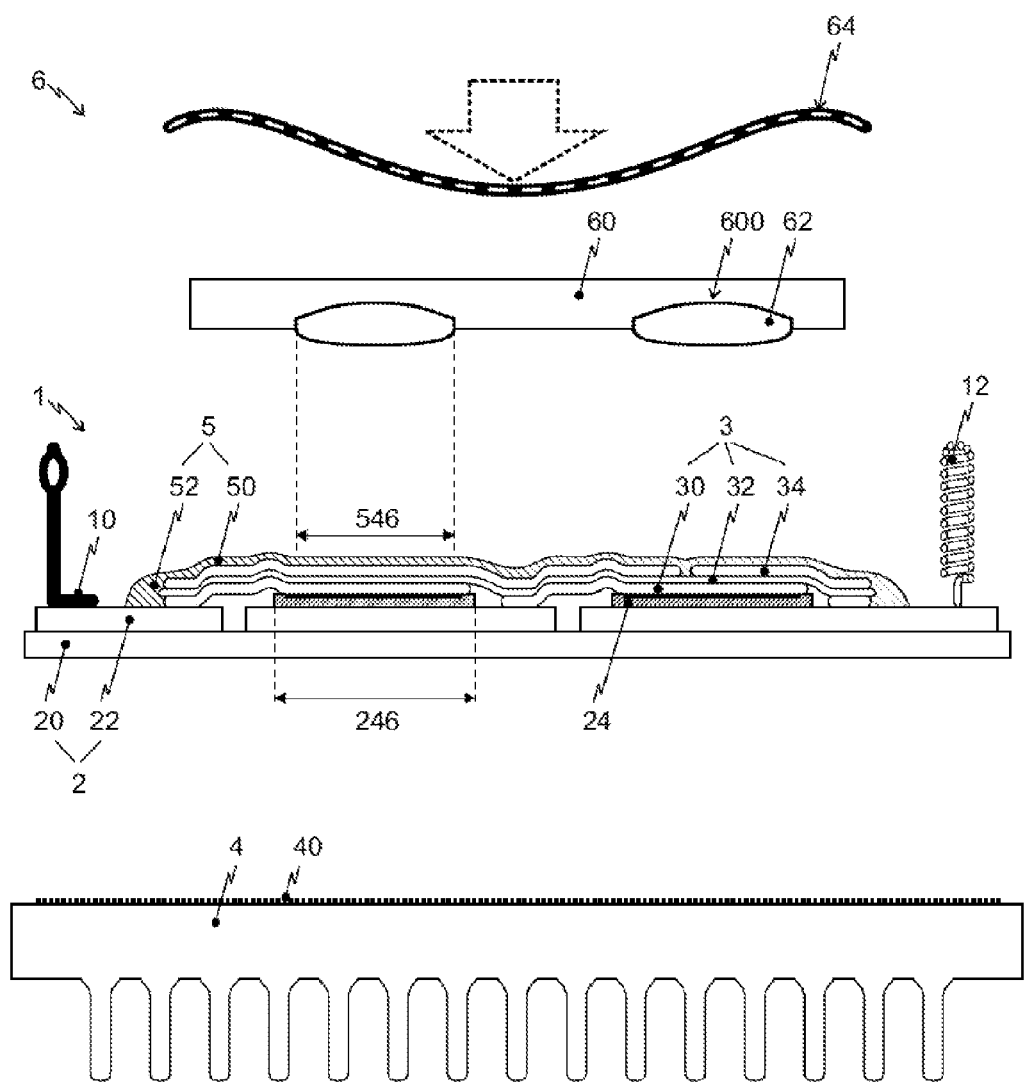
FIG. 1 shows an arrangement produced according to the invention and comprising a power electronic switching device in a schematic exploded illustration.

FIG. 1 shows an arrangement produced according to the invention. The inventive arrangement comprises a power electronic switching device 1 shown in a schematic exploded illustration. Power electronic switching device 1 comprises a substrate 2 having an insulation ply 20, herein the form of an insulating ceramic having a thickness of about 300 µm, with—arranged therein—conductor tracks 22 composed of copper likewise having a thickness of about 300 µm. Substrates 2 of this type are known from the prior art in general, i.e. including with thicknesses deviating therefrom. Power semiconductor components 24 are arranged on two of these conductor tracks 22 and are electrically conductively connected to conductor tracks 22. Power semiconductor components 24 have a lateral extent 246, directed parallel to the plane of the substrate 2, and thus an assigned area.

A connection device 3 serves for the further electrical connection of power semiconductor components 24 to further power semiconductor components or to other conductor tracks 22. Connection device 3 itself is embodied as a film stack composed of two electrically conductive films 30, 34 with an electrically insulating film 32 arranged therebetween. Electrically conductive films 30, 34 are embodied in a structured fashion and thus have a plurality of conduction sections. In a routine manner in the art, individual conduction sections of the two films are connected to one another by means of plated-through holes (not illustrated). At such plated-through holes, electrically insulating film 32 thus has a cutout.

An insulation layer 5 following the surface contour of connection device 3 is arranged on connection device 3. Insulation layer 5 has two sections, also cf. FIG. 4, a covering section 50 and an overlap section 52. Covering section 50 directly covers the entire connection device 3. Overlap section 52 projects beyond connection device 3 on all sides and thus adjoins covering section 50 directly on all sides and circumferentially.

Insulation layer 5 is formed here from LCP since LCP is particularly suitable on account of its material properties. LCP has very low moisture absorption. This leads to an outstanding moisture-blocking effect despite the small thickness, here of about 300 µm in the region of covering section 50, such that, on account of the whole-area coverage, no moisture can penetrate into connection device 3 or through the latter. In addition, LCP is sufficiently pressure- and temperature-stable. A pressure per unit area of about 10 MPa, for example, does not lead to damage to insulation layer 5. Temperatures of up to 200° C., such as can occur in power electronic switching devices with high loading, lead to just as little damage to insulation layer 5.

Figure 2:
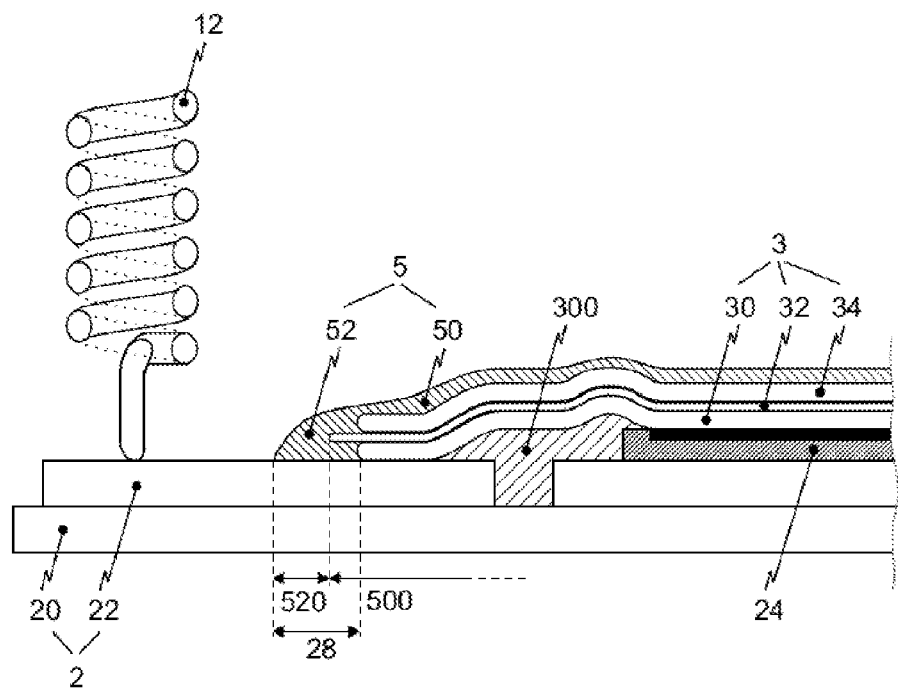
FIG. 2 shows a sectional view of a first configuration of a power electronic switching device produced by the inventive method.
Figure 3:
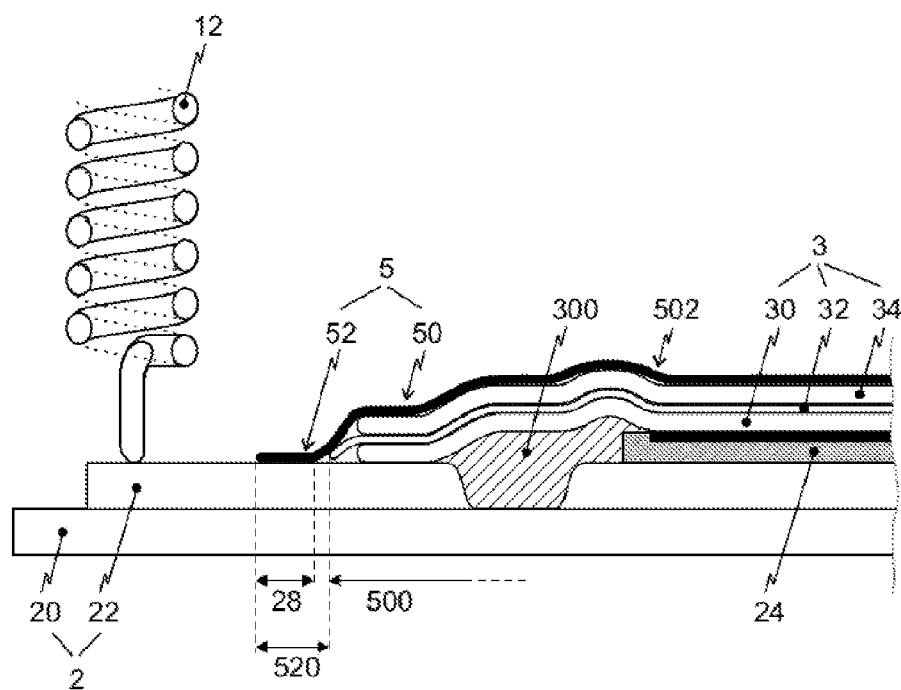
FIG. 3 shows a sectional view of a second configuration of a power electronic switching device produced by the inventive method.
Figure 4:
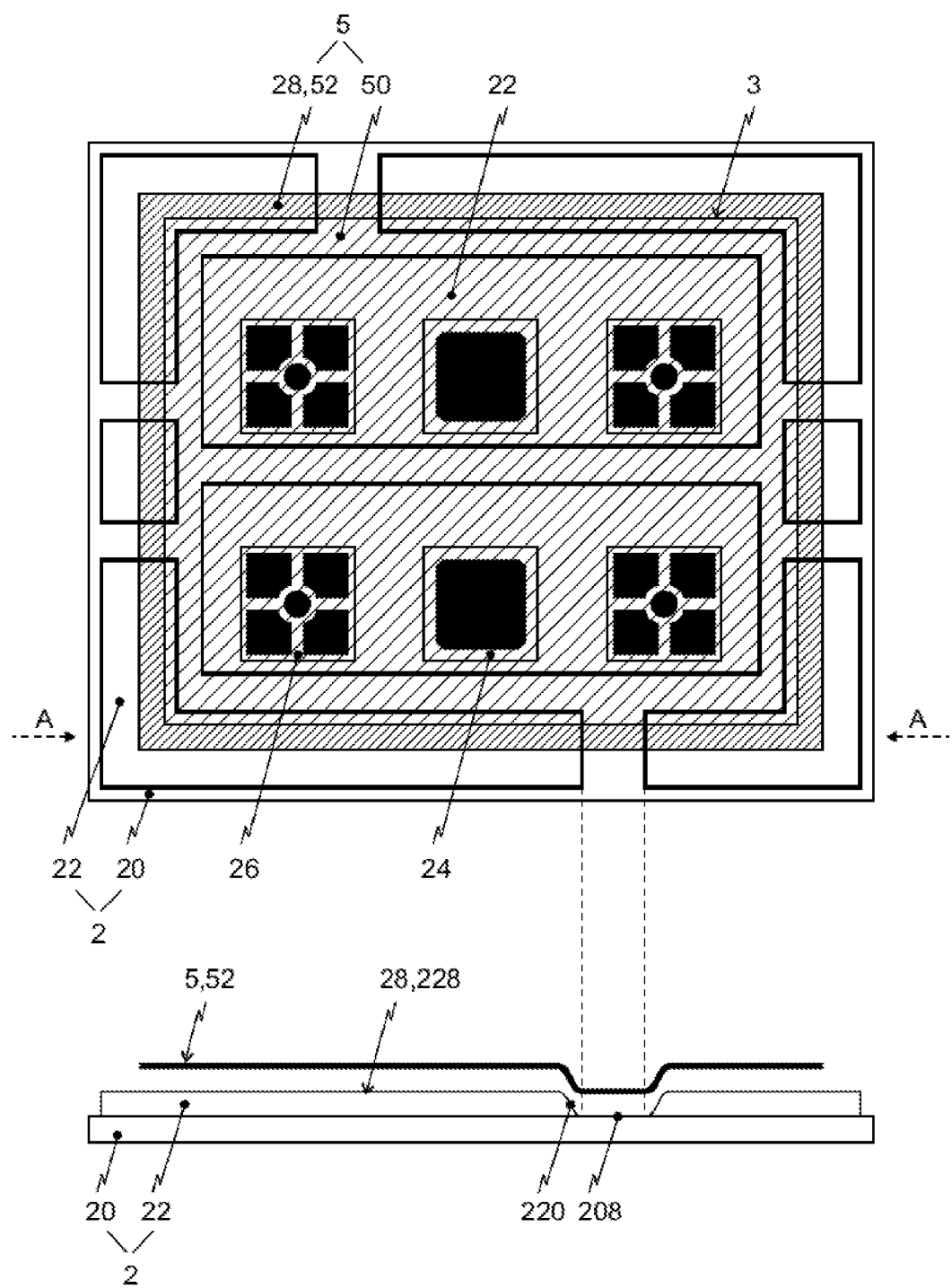
FIG. 4 shows a plan view, and also a further sectional view, of the second configuration of the power electronic switching device produced by the inventive method.

Overlap section 52 of insulation layer 5 covers a contact region 28, cf. FIGS. 2 to 4, of substrate 2, wherein contact region 28 is arranged circumferentially and in a closed fashion around connection device 3 and extends over parts of insulation ply 20, and also over parts of conductor tracks 22.

Furthermore, power electronic switching device 1 comprises terminal elements 10, 12 for contacting external electrical contacts. Terminal elements 10, 12 can be embodied as, for example, rigid metal shaped bodies 10, if appropriate with deformable contact devices, or as a spring contact device 12. In principle, a power electronic switching device 1 can comprise differently configured terminal elements 10, 12 simultaneously, if appropriate for different types of terminal. The terminal elements 10, 12 are arranged on conductor tracks 22 of substrate 2 and are electrically conductively connected thereto.

The arrangement furthermore comprises a heat sink 4, the surface of which is covered with a heat-conducting layer 40, on which power electronic switching device 1, more precisely substrate 2 thereof, is arranged.

Alternatively, insulation ply 20 of substrate 2 can be embodied as an electrically insulating film that is laminated directly onto heat sink 4. In this case, too, conductor tracks 22 can be embodied as planar conduction elements composed of copper. Advantageously, the conduction elements have a thickness of from about 0.5 mm to about 1.0 mm.

The arrangement furthermore comprises a pressure device 6, which is arranged above connection device 3 with insulation layer 5 and which comprises a pressure body 60 and pressure introducing elements 62. Pressure body 60, for its part, has a plurality of cutouts 600 with elastic pressure elements 62 arranged therein, which project from cutout 600 in the direction of connection device 3. Pressure elements 62 are assigned to power semiconductor components 24 and have a lateral extent 546 corresponding to an area, wherein this area corresponds to at least about 60% of the area of the assigned power semiconductor component 24. Consequently, pressure is applied to power semiconductor component 24 not at points, but rather over a large area.

Pressure is introduced onto pressure body 60 by means of pressure introducing element 64. Said pressure is exerted indirectly on the assigned power semiconductor components 24 by means of pressure elements 62 and presses power semiconductor components 24 together with substrate 2 onto heat sink 4 for the purpose of heat dissipation. The indirect introduction of pressure takes place via insulation layer 5 and connection device 3 between pressure element 62 and the assigned power semiconductor component 24.

FIG. 2 shows a sectional view of a first configuration of a power electronic switching device 1 produced by the inventive method and such as has basically been illustrated in FIG. 1.

The illustration here shows substrate 2, comprising an insulation ply 20 and two conductor tracks 22. A terminal element 12, embodied here by way of example as a spring contact element, is arranged on the left conductor track. A power semiconductor component 24, embodied as a power diode, is arranged on the right conductor track and is electrically conductively connected by means of a cohesive connection, here, by example only, a pressure sintering connection.

Power semiconductor component 24, more precisely its contact area facing away from substrate 2, is electrically conductively connected to the left conductor track by a connection device 3. For this purpose, connection device 3 comprises a first electrically conductive film 30, which, likewise without restricting generality, is connected by a pressure sintering connection to the contact area of power semiconductor component 24 and to the conductor track 22. Connection device 3 furthermore comprises an electrically insulating film 32 and a further electrically conductive film 34, which in cooperation form the circuit-conforming internal connection of power electronic switching device 1.

Connection device 3 is completely covered by a covering section 50 of insulation layer 5. In this configuration, insulation layer 5 was applied as a liquid to connection device 3, for example by pouring, and thus has for covering section 50 a minimum thickness of about 100 μm and a maximum thickness of about 250 μm, in each case measured in the direction of the normal to substrate 2.

Insulation layer 5 furthermore has an overlap section 52, which projects beyond connection device 3 on all sides and bears on a contact region 28 of substrate 2. This reliably prevents ingress of moisture both from above through connection device 3 and laterally between substrate 2 and connection device 3. Overlap section 52 in this case laterally has a smaller extent 520 in its projection onto substrate 2 compared with the lateral extent of contact region 28, which here extends under insulating film 32.

Insulation layer 5 is formed here from liquid crystal polymer—LCP—, an embodiment formed from polyphenylene sulfide—PPS—likewise being possible in principle. The liquid insulation layer was applied to composite comprising substrate 2, power semiconductor component 24 and connection device 3, wherein the cohesive connections of the composite had already been formed. Directly after application, insulation layer 5 was cured, or is cured independently. What is essential to insulation layer 5 produced in the context of the invention is that it has no appreciable deformation under application of pressure, is temperature-resistant to 0° C. and has a moisture absorption of less than about 0.1%, measured according to ISO 62.

In addition, power electronic switching device 1 also has a further, preferably gel-like, insulating substance 300 arranged in the interspace between substrate 2, connection device 3 and power semiconductor component 24. Insulating substance 300 serves for internal electrical insulation, in particular that between the first conductive film 30 of connection device 3 and right conductor track 22 of substrate 2.

FIG. 3 shows a sectional view of a second configuration of a power electronic switching device 1 produced by means of the method according to the invention and such as has basically already been illustrated in FIGS. 1 and 2.

Insulation layer 5 is formed here from liquid crystal polymer—LCP—, an embodiment formed from polyphenylene sulfide—PPS—likewise being possible in principle. Insulation layer 5 was present as a film here at all times during the production of power electronic switching device 1.

Connection device 3 is completely covered by a covering section 50 of insulation layer 5. In this configuration, insulation layer 5 has a thickness of about 300 μm both in the covering section 50 and in overlap section 52. What is essential here is that covering section 50 does not necessarily bear on connection device 3 over the whole area, rather small regions 502 can be present in which insulation layer 5 is slightly spaced apart from connection device 3, without the function being impaired as a result.

Overlap section 52 bears on a contact region 28 of substrate 2 and is connected thereto in a moisture-tight fashion. This in turn reliably prevents ingress of moisture both from above through connection device 3 and laterally between substrate 2 and connection device 3. In this case, overlap section 52 laterally has a slightly larger extent 520 in its projection onto substrate 2 compared with the lateral extent of contact region 28.

FIG. 4 shows a plan view, and also a further sectional view along the line A-A, of the second configuration of the inventive power electronic switching device.

The illustration again shows substrate 2 comprising a plurality of conductor tracks 22, the two inner conductor tracks of which carry the power semiconductor components 24, 26, here power transistors and power diodes. Further conductor tracks 22 serve, inter alia, for external electrical connection, cf. FIGS. 1 to 3.

Connection device 3, which incidentally is not illustrated in detail, connects power semiconductor components 24, 26 or inner conductor tracks 22 to further conductor tracks 22. Insulation layer 5 having a covering section 50 and an overlap section 52 is arranged on connection device 3.

Overlap section 52 is connected to contact region 28 of substrate 2. Here, contact region 28 of substrate 2 comprises area sections 228 of conductor tracks and area sections 208 of insulation ply 20. In the course of contact region 28, the respective transition between these area sections is embodied in a continuous fashion, as a result of which an adhesion of insulation layer 5 to substrate 2 that is particularly good in these regions as well is ensured and the function as a moisture barrier is thus also implemented particularly well.

In the preceding Detailed Description, reference was made to the accompanying drawings, which form a part of this disclosure, and in which are shown illustrative specific embodiments of the invention. In this regard, directional terminology, such as "top", "bottom", "left", "right", "front", "back", etc., is used with reference to the orientation of the Figure(s) with which such terms are used. Because components of embodiments can be positioned in a number of different orientations, the directional terminology is used for purposes of ease of understanding and illustration only and is not to be considered limiting.

Additionally, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for producing a power electronic switching device, the power electronics switching device comprising a substrate, a power semiconductor component arranged on the substrate, a connection device and terminal devices, the method comprising the following steps:
   A. providing the substrate with an insulation ply and at least first and second conductor tracks electrically insulated from one another, wherein the power semiconductor component is arranged on one of said first and second conductor tracks and is cohesively connected to said one of said first and second conductor tracks;
   B. arranging the connection device as a layered film stack having alternating layers with at least two electrically conductive, intrinsically structured films, and an electrically insulating film between said two conductive films;
   C. applying a thin pressure- and temperature-resistant and moisture-blocking insulation layer to a surface contour of the connection device, said insulation layer comprising a covering section which covers the connection device and an overlap section, which overlaps the connection device circumferentially on all sides and covers the substrate in a circumferential contact region;
   D. cohesively connecting the connection device to the substrate, whereby the power electronic switching device is connected in a circuit-conforming manner internally by means of the connection device;
   E. connecting said covering section of said insulation layer to the connection device; and
   F. connecting said overlap section of said insulation layer to said contact region of the substrate.

2. The method of claim 1, wherein the method steps are performed in the order A-B-C-D-E-F and method steps E and F are performed simultaneously.

3. The method of claim 1, wherein the method steps are performed in the order A-B-D-C-E-F, and method steps E and F are performed simultaneously.

4. The method of claim 1, wherein the method steps are performed in the order A-E-B-C-D-F.

5. The method of claim 1, wherein the method steps are performed in the order A-E-B-D-C-F.

6. The method of claim 1, wherein the method steps are performed in the order A-B-C-D-E-F and method steps D, E and F are performed simultaneously.

7. The method of claim 1, wherein at least the covering section of the insulation layer has a thickness in the range having a maximum of about 1 mm, and a minimum of about 50 μm.

8. The method of claim 7, wherein said thickness of at least said covering section of said insulation layer has a minimum of at least about 150 μm.

9. The method of claim 1, wherein said insulation layer is composed of polyphenylene sulfide.

10. The method of claim 1, wherein said insulation layer is composed of a liquid crystal polymer.

11. The method of claim 1, wherein said insulation layer is formed as a film and is arranged as such.

12. The method of claim 11, wherein said film is formed with one or more plies.

13. The method of claim 12, wherein said film has at least three plies including at least one metallic intermediate ply.

14. The method of claim 11, wherein said film bears directly on the connection device to the extent of at least about 90%.

15. The method of claim 14, wherein said film bears directly on the connection device to the extent of at least about 95%.

16. The method of claim 1, wherein said insulation layer, prior to being arranged, is in liquid form, and is arranged by one of spraying and pouring.

17. The method of claim 16, wherein the liquid form of said insulation layer is cured after being arranged.

18. The method of claim 1, wherein said contact region of the substrate comprises area sections of conductor tracks and area sections of the insulation ply and in its course the transition between these area sections are formed in a continuous fashion.

19. A method for producing an arrangement comprising a power electronic switching device, a cooling device and a pressure device having a pressure body with a first cutout, including an elastic pressure element projecting therefrom, the method comprising the following steps in this order:
   a) providing the power electronic switching device produced by claim 1;
   b) arranging the power electronic switching device on the cooling device;
   c) arranging the pressure device, so that the pressure element presses on a section of said insulation layer which, in projection along the direction of the normal to the power semiconductor component, is arranged within the area of the power semiconductor component; and d) applying pressure to the conductor track and thus thermally linking the substrate of the circuit arrangement to the cooling device.

20. The method of claim 19, wherein the cooling device is a baseplate of one of a power semiconductor module and a heat sink.

21. The method of claim 19, wherein the pressure element in projection covers at least about 60% of the area of the power semiconductor component.

22. The method of claim 19, wherein the pressure device has a spring-elastic pressure introducing body that exerts pressure centrally on the pressure device.

* * * * *